(12) United States Patent
Tuttle

(10) Patent No.: US 10,692,793 B2
(45) Date of Patent: Jun. 23, 2020

(54) ELECTRONIC DEVICE WITH A PACKAGE-LEVEL THERMAL REGULATOR MECHANISM AND ASSOCIATED SYSTEMS, DEVICES, AND METHODS

(71) Applicant: Micron Technology, Inc., Boise, ID (US)

(72) Inventor: Mark E. Tuttle, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 15/910,590

(22) Filed: Mar. 2, 2018

(65) Prior Publication Data

US 2019/0273029 A1 Sep. 5, 2019

(51) Int. Cl.
| | | |
|---|---|---|
| *H01L 23/34* | (2006.01) | |
| *H01L 25/10* | (2006.01) | |
| *H01L 23/31* | (2006.01) | |
| *H01L 21/56* | (2006.01) | |
| *H01L 25/00* | (2006.01) | |
| *H01L 25/18* | (2006.01) | |
| *H01L 23/38* | (2006.01) | |

(52) U.S. Cl.
CPC .......... *H01L 23/345* (2013.01); *H01L 21/56* (2013.01); *H01L 23/3114* (2013.01); *H01L 23/34* (2013.01); *H01L 23/38* (2013.01); *H01L 25/105* (2013.01); *H01L 25/18* (2013.01); *H01L 25/50* (2013.01); *H01L 2225/1058* (2013.01); *H01L 2225/1094* (2013.01)

(58) Field of Classification Search
CPC . H01L 23/345; H01L 25/105; H01L 23/3114; H01L 23/34; H01L 21/56; H01L 25/50; H01L 25/18; H01L 23/38; H01L 2225/1094; H01L 2225/1058; H01L 23/295; H01L 23/3135; H01L 23/3128; H01L 23/3107; H01L 23/367; H01L 21/50

See application file for complete search history.

(56) References Cited

U.S. PATENT DOCUMENTS

| | | | | |
|---|---|---|---|---|
| 4,931,852 | A * | 6/1990 | Brown | H01L 23/295 |
| | | | | 257/746 |
| 6,292,365 | B1 * | 9/2001 | Ashiwake | H01L 23/473 |
| | | | | 165/104.21 |
| 6,552,945 | B2 * | 4/2003 | Cooper | G11C 7/04 |
| | | | | 365/211 |
| 6,985,000 | B2 * | 1/2006 | Feder | G01R 31/2874 |
| | | | | 324/750.05 |
| 7,265,993 | B1 | 9/2007 | Slone et al. | |
| 9,286,991 | B1 * | 3/2016 | Walker | G11C 7/04 |
| 9,761,543 | B1 * | 9/2017 | Male | H01L 35/32 |

(Continued)

OTHER PUBLICATIONS

U.S. Appl. No. 15/910,612—Unpublished Patent Application by Mark E. Tuttle, titled "Electronic Device with a Card-Level Thermal Regulator Mechanism and Associated Systems, Devices, and Methods", filed Mar. 2, 2018, 26 pages.

*Primary Examiner* — Jarrett J Stark
(74) *Attorney, Agent, or Firm* — Perkins Coie LLP

(57) ABSTRACT

A semiconductor device includes a substrate; a die attached to the substrate; an encapsulation covering the substrate and the die, wherein the die is embedded within the encapsulation; and a heating element embedded within the encapsulation, wherein the heating element is configured to provide thermal energy to the die.

13 Claims, 4 Drawing Sheets

(56) References Cited

U.S. PATENT DOCUMENTS

| | | | |
|---|---|---|---|
| 2002/0037633 A1* | 3/2002 | Satou | B81B 7/0038 |
| | | | 438/476 |
| 2002/0076859 A1* | 6/2002 | Johnson | H01L 21/56 |
| | | | 438/126 |
| 2005/0224849 A1* | 10/2005 | Isenberger | G11C 11/22 |
| | | | 257/295 |
| 2007/0254411 A1* | 11/2007 | Uhland | B81C 1/0023 |
| | | | 438/127 |
| 2008/0032446 A1 | 2/2008 | Wood et al. | |
| 2009/0159904 A1* | 6/2009 | Lai | H01L 25/075 |
| | | | 257/88 |
| 2009/0244842 A1 | 10/2009 | Iwakiri | |
| 2010/0230807 A1* | 9/2010 | Bronner | G11C 16/3418 |
| | | | 257/734 |
| 2011/0114840 A1* | 5/2011 | Yamazaki | G01J 5/04 |
| | | | 250/338.1 |
| 2011/0193008 A1* | 8/2011 | Fieback | C09K 5/063 |
| | | | 252/67 |
| 2012/0035773 A1 | 2/2012 | Stabinski et al. | |
| 2012/0097361 A1 | 4/2012 | Yang | |
| 2012/0120582 A1 | 5/2012 | Nguyen | |
| 2012/0320523 A1 | 12/2012 | Murakami et al. | |
| 2013/0126013 A1* | 5/2013 | Peterson | F17D 1/00 |
| | | | 137/334 |
| 2013/0139524 A1* | 6/2013 | Kim | F25B 21/02 |
| | | | 62/3.7 |
| 2013/0194057 A1* | 8/2013 | Ruby | H03H 3/02 |
| | | | 333/188 |
| 2013/0264610 A1* | 10/2013 | Chen | B81C 1/0023 |
| | | | 257/252 |
| 2014/0063721 A1* | 3/2014 | Herman | G06F 1/20 |
| | | | 361/679.31 |
| 2014/0159231 A1* | 6/2014 | Lundberg | B82Y 10/00 |
| | | | 257/737 |
| 2014/0183957 A1 | 7/2014 | Duchesneau | |
| 2014/0374726 A1* | 12/2014 | Goeoetz | H01L 51/529 |
| | | | 257/40 |
| 2015/0092509 A1* | 4/2015 | Kim | G01K 1/026 |
| | | | 365/230.01 |
| 2016/0113127 A1* | 4/2016 | Salminen | H01L 23/145 |
| | | | 361/728 |
| 2016/0161314 A1* | 6/2016 | Hunziker | G01F 1/688 |
| | | | 73/204.21 |
| 2016/0334845 A1* | 11/2016 | Mittal | G01K 7/04 |
| 2017/0014174 A1 | 1/2017 | Levine et al. | |
| 2017/0118860 A1 | 4/2017 | Miwa | |
| 2019/0103579 A1* | 4/2019 | Kim | H01L 51/5243 |

\* cited by examiner

ELECTRONIC DEVICE WITH A PACKAGE-LEVEL THERMAL REGULATOR MECHANISM AND ASSOCIATED SYSTEMS, DEVICES, AND METHODS

RELATED APPLICATION(S)

This application contains subject matter related to a concurrently filed U.S. patent application by Mark E. Tuttle titled "ELECTRONIC DEVICE WITH A CARD-LEVEL THERMAL REGULATOR MECHANISM AND ASSOCIATED SYSTEMS, DEVICES, AND METHODS." The related application is assigned to Micron Technology, Inc., and is identified by U.S. Pat. No. 15/910,612. The subject matter thereof is incorporated herein by reference thereto.

TECHNICAL FIELD

The present technology is related to electronic devices, and, in particular, to electronic devices with a package-level temperature regulating mechanism.

BACKGROUND

Electronic devices (e.g., semiconductor devices, such as memory chips, microprocessor chips, or imager chips) typically include a semiconductor die mounted on another structure (e.g., a substrate, another die, etc.) and encased in a protective covering (e.g., plastic encapsulations). The die includes functional features, such as for memory cells, processor circuits, and imager devices, as well as interconnects that are electrically connected to the functional features. The interconnects can be electrically connected to terminals outside the protective covering to connect the die to higher level circuitry.

Electronic devices can behave differently at different temperatures. For example, at higher temperatures, an electronic device can experience data errors (e.g., during operation) and/or structural failures (e.g., exacerbated by or independent of device operation). Generally, operating electronic devices at lower temperatures can permit faster operation and/or better performance (e.g., reduced noise). At extremely low (e.g., cryogenic) operating temperatures, however, some electronic devices can experience other undesirable effects, including reduced performance and/or structural failures (e.g., due in part to a thermal gradient between heat-generating features of the device and other portions of the device).

DETAILED DESCRIPTION

Figure 1:
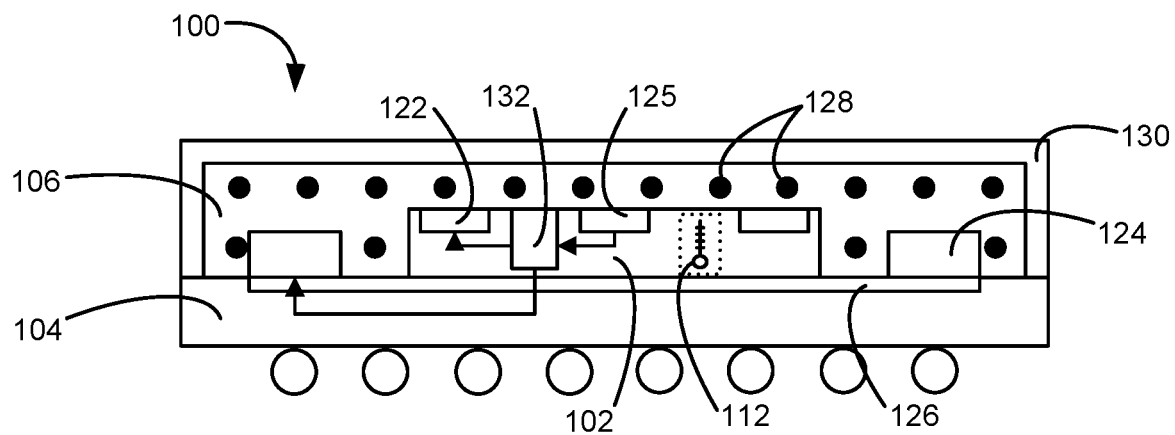
FIG. 1 is a cross-sectional view of an electronic device in accordance with an embodiment of the present technology.

The technology disclosed herein relates to electronic devices (e.g., semiconductor devices), systems including the electronic devices, and related methods for manufacturing and operating the electronic devices and systems. The term "semiconductor device" generally refers to a solid-state device that includes one or more semiconductor materials. Examples of semiconductor devices include logic devices, memory devices, imagers, and diodes, among others. Furthermore, the term "semiconductor device" can refer to a finished device or to an assembly or other structure at various stages of processing before becoming a finished device. Depending upon the context in which it is used, the term "substrate" can refer to a structure that supports electronic components (e.g., a die), such as a wafer-level substrate or to a singulated die-level substrate, or another die for die-stacking or 3DI applications. A person having ordinary skill in the relevant art will recognize that suitable steps of the methods described herein can be performed at the wafer-level or at the die level. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques.

Many embodiments of the present technology are described below in the context of regulating operating temperature of the electronic devices. For example, the electronic devices can include one or more temperature-control components (e.g., heating elements, such as die-level heaters and/or package-level heaters, Peltier devices, thermal contacts, such as thermal trace or die attach pads, thermal-conduction components in encapsulations, thermal-isolation component over the encapsulations, etc.) to keep a temperature of the device (e.g., the operating temperature) above a threshold or target level.

As an illustrative example, some categories of devices can use one or more temperature-control components to regulate the operating temperatures for operating in environments with extreme temperatures (e.g., at higher altitudes where the environmental temperatures are significantly lower than near sea-levels). In some instances, one device or system can include components or subsystems (e.g., logic dies) that benefit from lower (e.g., cryogenic) operating temperatures, along with other components or subsystems (e.g., memory dies) that benefit from relatively higher operating temperatures. For such devices, the overall device or system can implement lower external or environmental temperatures (e.g., cryogenic temperatures approaching absolute zero based on cryogenic baths or cryogenic cooling systems) and use the one or more temperature-control components to maintain the higher operating temperatures for the corresponding components or subsystems.

In some embodiments, the electronic devices can include one or more heating elements (e.g., resistors configured to increase thermal energy independent of circuit/signal contributions) on or embedded within semiconductor dies, substrates, encapsulations, or a combination thereof. In some embodiments, the electronic devices can include Peltier devices (e.g., thermoelectric coolers/heaters that use the Peltier effect to create a heat flux between a cold portion and a hot portion on the device) that heat the corresponding device or component (e.g., one of the packages on a package-on-package (POP) device) and/or cools the corresponding device or component (a different package on the POP device). In some embodiments, the electronic devices can include thermal contacts (e.g., traces or die-attach pads configured to conduct thermal energy), thermal-conduction components (e.g., thermally conductive additives or compositions) for encapsulations, thermal-isolation components (e.g., thermal insulators) surrounding the encapsulations, thermally-conductive through silicon vias (TSVs) and/or through mold vias (TMVs), or a combination thereof for regulating the operating temperature (e.g., for heating at least a portion of the device to maintain the operating temperature thereof above the colder environmental temperatures).

As used herein, the terms "vertical," "lateral," "upper" and "lower" can refer to relative directions or positions of features in the semiconductor die assemblies in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down and left/right can be interchanged depending on the orientation.

FIG. 1 is a cross-sectional view of an electronic device 100 (e.g., a semiconductor die assembly or package, such as a 3DI device or a die-stacked package) in accordance with an embodiment of the present technology. The electronic device 100 can include a semiconductor die 102 ("die 102") mounted on or connected to a substrate 104 (e.g., another die, a printed circuit board, wafer substrate, etc.). The die 102 can be electrically connected to the substrate 104 through metal or conductive interconnects, such as wires or traces. The electronic device 100 can further include an encapsulation 106 (e.g., plastic or resin material, ceramic, metal, etc.) covering and/or enclosing the die 102, the substrate 104, a portion thereof, or a combination thereof for protecting the encapsulated components.

The electronic device 100 can operate in an environment with extremely low temperatures (e.g., in comparison to ambient/room temperature, such as at or near cryogenic temperatures corresponding to high altitudes or based on baths or cooling system using liquid argon, helium, nitrogen, etc.). To maintain an operating temperature 112 of the die 102 above the external temperatures or within a target range, the electronic device 100 can include temperature-control components. For example, the electronic device 100 can include one or more heating elements, such as die-level heaters 122 (e.g., resistors attached to or integral with the die 102) and/or package-level heaters 124 (e.g., resistors attached to or integral with the substrate 104 or embedded within the encapsulation 106), that can use electricity to generate thermal energy (e.g., via Joule heating).

The electronic device 100 can further include one or more thermal sensors 125 configured to detect the operating temperature 112 for controlling the heating elements. For example, the die 102 can include temperature control circuit 132 electrically coupled to the thermal sensors 125 and the heating elements. The temperature control circuit 132 can operate or control the heating elements according to signals or outputs from the thermal sensors 125.

The electronic device 100 can further include structures or components to distribute the thermal energy. For example, the electronic device 100 can include one or more thermal contacts 126 (e.g., one or more thermally conductive traces, die-attach pads, die enclosures, etc.) configured to transfer the thermal energy from the heating elements to other portions or components in the device, such as the die 102. Also for example, the electronic device 100 can include thermal-conduction component 128 in the encapsulation 106. The thermal-conduction component 128 can distribute the thermal energy, such as from the package-level heaters 124 to the die 102 or for even distribution of the thermal energy across the die 102. In some embodiments, the encapsulation 106 can be formed using an epoxy molding compound that has thermally conductive properties. In some embodiments, the encapsulation 106 can include the thermal-conduction component 128 as additives (e.g., suspended structures).

In some embodiments, the electronic device 100 can include a thermal-isolation component 130, such as a covering or a separate layer of epoxy encapsulation, configured to thermally separate the die 102 from the surrounding environment. The thermal-isolation component 130 can include thermal insulators covering and enclosing the encapsulation 106, the die 102, the substrate 104, or a combination thereof.

Figure 2:
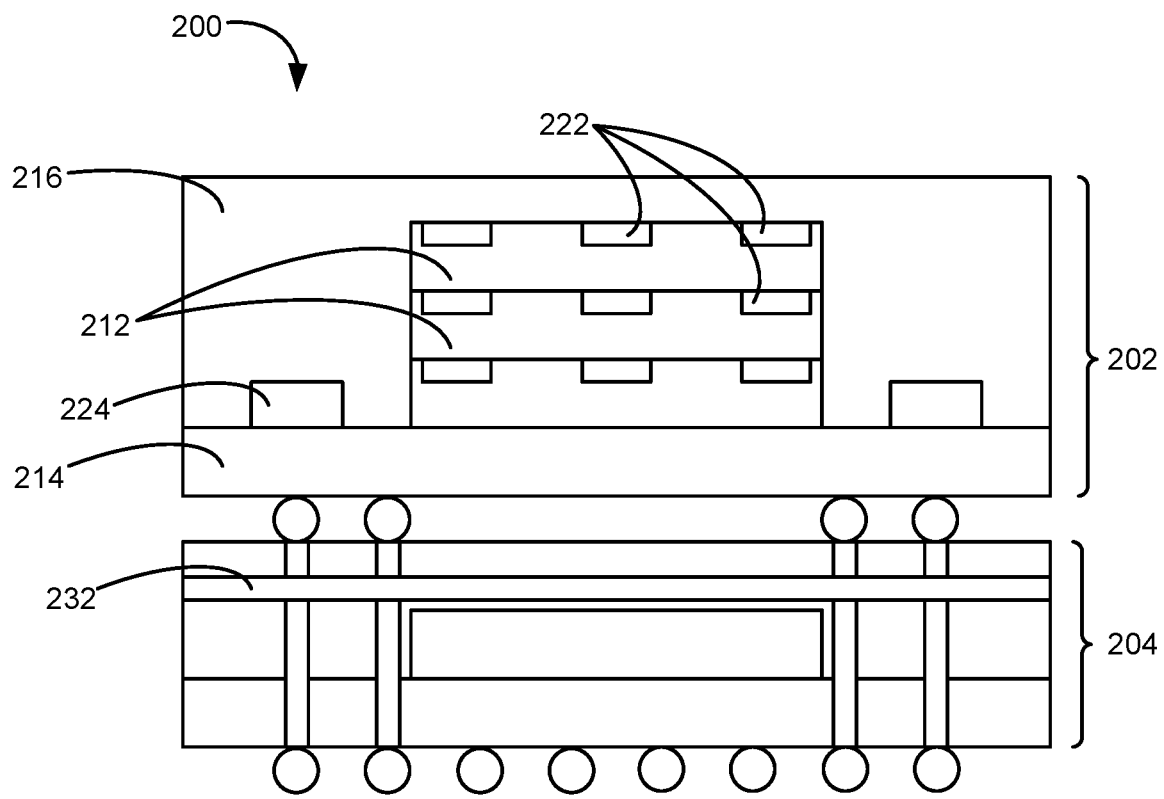
FIG. 2 is a cross-sectional view of an electronic device in accordance with a further embodiment of the present technology.

FIG. 2 is a cross-sectional view of an electronic device 200 (e.g., a semiconductor die assembly or package, including a POP device) in accordance with a further embodiment of the present technology. The electronic device 200 can include a first package 202 (e.g., a memory device), a second package 204 (e.g., a logic device), or a combination thereof. The first package 202, the second package 204, or a combination thereof can be semiconductor die assemblies or packages.

The first package 202, the second package 204, or a combination thereof can include one or more semiconductor dies 212 ("die 212") mounted on or connected to a substrate 214 (e.g., another die, a printed circuit board, wafer substrate, etc.). The die 212 can be electrically connected to the substrate 214 through metal or conductive interconnects, such as wires or traces. One or more of the packages can include an encapsulation 216 (e.g., plastic or resin material, ceramic, metal, etc.) covering and/or enclosing the die 212, the substrate 214, a portion thereof, or a combination thereof for protecting the encapsulated components.

The first package 202 can be connected to the second package 204 (e.g., for the POP device). For example, the first package 202 can be above the second package 204 and be connected through adhesive mechanisms (e.g., solder, resin or chemical attachments, mechanical attachments, etc.). In some embodiments, the substrate 214 of the first package 202 can be attached to the encapsulation 216 of the second package 204 using solder.

The first package 202 and the second package 204 can be electrically connected to each other. In some embodiments, the first package 202 and the second package 204 can include one or more TSVs for routing electrical signals to or from an attached device.

The electronic device 200 can include devices that provide improved operations in differing environments. For example, the performance of the second package 204 (e.g., a logic device) can improve as the operating temperature 112 of FIG. 1 thereof decreases (e.g., for targeting operation at a cryogenic temperature, such as by immersion in a bath of liquid Argon, Helium, Nitrogen, etc.). The performance of the first package 202 (e.g., a memory device) can improve at the operating temperature 112 that is higher than the second package 204 (e.g., at non-cryogenic temperature). The performance of the electronic device 200 can be improved based on cooling the entire device (e.g., based on immersion in cryogenic bath or circulating cryogenic liquids) and heating the package or portions that provide improved performance at higher temperatures. Accordingly, the corresponding package or device (e.g., the first package 202) can include one or more heating elements, such as die-level heaters 222 (e.g., resistors attached to or integral with the one or more dies 212 of the first package 202) and/or package-level heaters 224 (e.g., resistors attached to or integral with the substrate 214 or embedded within the encapsulation 216 of the first package 202), that can use electricity to generate thermal energy.

The first package 202 can further include one or more thermal sensors (e.g., the thermal sensors 125 of FIG. 1) configured to detect the operating temperature 112 of the first package 202. The first package 202 can further include control circuit (e.g., the temperature control circuit 132 of FIG. 1) electrically coupled to the thermal sensors and the heating elements. The control circuits can operate or control the heating elements according to signals or outputs from the thermal sensors.

In some embodiments, the portion or device within the electronic device 200 that operates better under colder temperatures (e.g., the second package 204) can further include temperature-control components. The temperature-control components for such devices or portions can be configured to thermally conduct internal portions thereof to the environment, such as for removing the thermal energy from the internal portions. For example, the second package 204 can include one or more thermally-conductive TSVs 232 (e.g., thermally conductive material, such as metallic structures) configured to transfer the thermal energy out of internal portions of the second package 204. The thermally-conductive TSVs 232 can extend through the encapsulation 216 of the second package 204. The thermally-conductive TSVs 232 can also be configured to communicate electrical signals to or from outside of the second package 204, such as for electrically-conductive TSVs.

Figure 3:
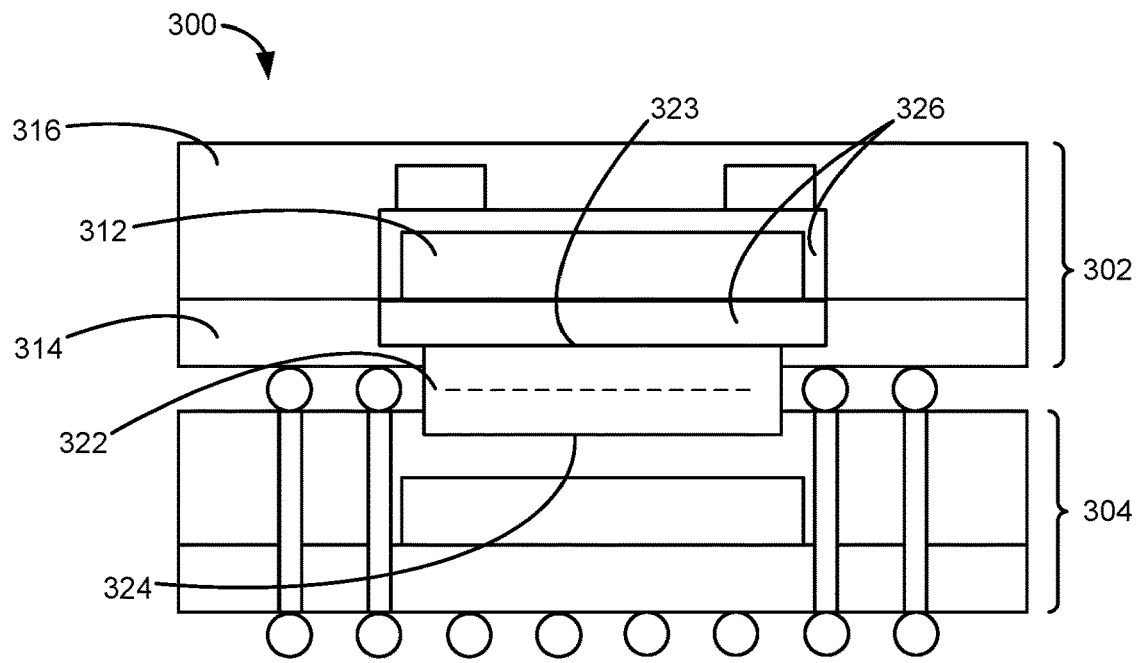
FIG. 3 is a cross-sectional view of an electronic device in accordance with a further embodiment of the present technology.

FIG. 3 is a cross-sectional view of an electronic device 300 (e.g., a semiconductor die assembly or package, including a POP device) in accordance with a further embodiment of the present technology. The electronic device 300 can include a first package 302 (e.g., a memory device), a second package 304 (e.g., a logic device), or a combination thereof. The first package 302, the second package 304, or a combination thereof can be semiconductor die assemblies or packages.

The first package 302, the second package 304, or a combination thereof can include one or more semiconductor dies 312 ("die 312") mounted on or connected to a substrate 314 (e.g., another die, a printed circuit board, wafer substrate, etc.). The die 312 can be electrically connected to the substrate 314 through metal or conductive interconnects, such as wires or traces. One or more of the packages can include an encapsulation 316 (e.g., plastic or resin material, ceramic, metal, etc.) covering and/or enclosing the die 312, the substrate 314, a portion thereof or a combination thereof for protecting the encapsulated components.

The first package 302 can be connected to the second package 304 (e.g., for the POP device). For example, the first package 302 can be above the second package 304 and be connected through adhesive mechanisms (e.g., solder, resin or chemical attachments, mechanical attachments, etc.). In some embodiments, the substrate 314 of the first package 302 can be attached to the encapsulation 316 of the second package 304 using solder.

The first package 302 and the second package 304 can be electrically connected to each other. In some embodiments, the first package 302 and the second package 304 can include one or more TSVs for routing electrical signals to or from an attached device.

Similar to the electronic device 200 of FIG. 2, the electronic device 300 can include devices that provide improved operations in differing environments. For example, the second package 304 (e.g., a logic device) can be targeted for operation under lower temperature (e.g., at or near cryogenic temperature) and the first package 302 (e.g., a memory device) can be targeted for operation at higher temperature (e.g., at non-cryogenic temperature).

For improving performance, the electronic device 300 can include one or more heating elements, such as a Peltier device 322 having a heating portion 323 and a cooling portion 324 opposite the heating portion 323. The Peltier device 322 can use electrical energy to create a thermal flux to decrease the thermal energy on the cooling portion 324 and simultaneously increase the thermal energy on the heating portion 323. The cooling portion 324 can be attached to and thermally coupled to the device or portion targeted for operation under lower temperature (e.g., the second package 304 including the logic die). The heating portion 323 can be attached to and thermally coupled to the device or portion targeted for operation at higher temperature (e.g., the first package 302 including the memory die). In some embodiments, the heating portion 323 can be directly attached to or through the substrate 314 of the first package 302. The cooling portion 324 can be directly attached or embedded in the encapsulation 316 of the second package 304.

In some embodiments, one or more of the packages can include one or more thermal sensors, one or more temperature control circuits, or a combination thereof electrically coupled to the heating element. The electronic device 300 can use the thermal sensor, the temperature control circuit, or a combination thereof to control and operate the Peltier device 322 and control the operating temperature 112 of the first package 302, the second package 304, or a combination thereof.

In some embodiments, the entirety of the electronic device 300 can further be cooled (e.g., based on immersion in cryogenic bath or circulating cryogenic liquids). The first package 302 can maintain the operating temperature 112 at a higher level (e.g., above cryogenic temperatures) based on the heating portion 323 of the Peltier device 322. In some embodiments, the first package 302 can further include one or more die-level heaters, one or more package-level heaters, or a combination thereof for maintaining the operating temperature 112 at the higher level.

In some embodiments, the electronic device 300 (e.g., at the first package 302, the second package 304, or a combination thereof) can include one or more thermal contacts 326 (e.g., thermally conductive structures, such as metal die-attach pad or die-enclosure) configured to distribute and transfer thermal energy. The thermal contacts 326 can be directly attached to the die 312 and the Peltier device 322. The thermal contacts 326 can transfer the thermal energy to or from the die 312 and the Peltier device 322 (e.g., away from the logic die to the cooling portion 324, and/or to the memory die from the heating portion 323). The thermal contacts 326 can further be configured to evenly distribute the thermal energy throughout the connected die.

Figure 4:
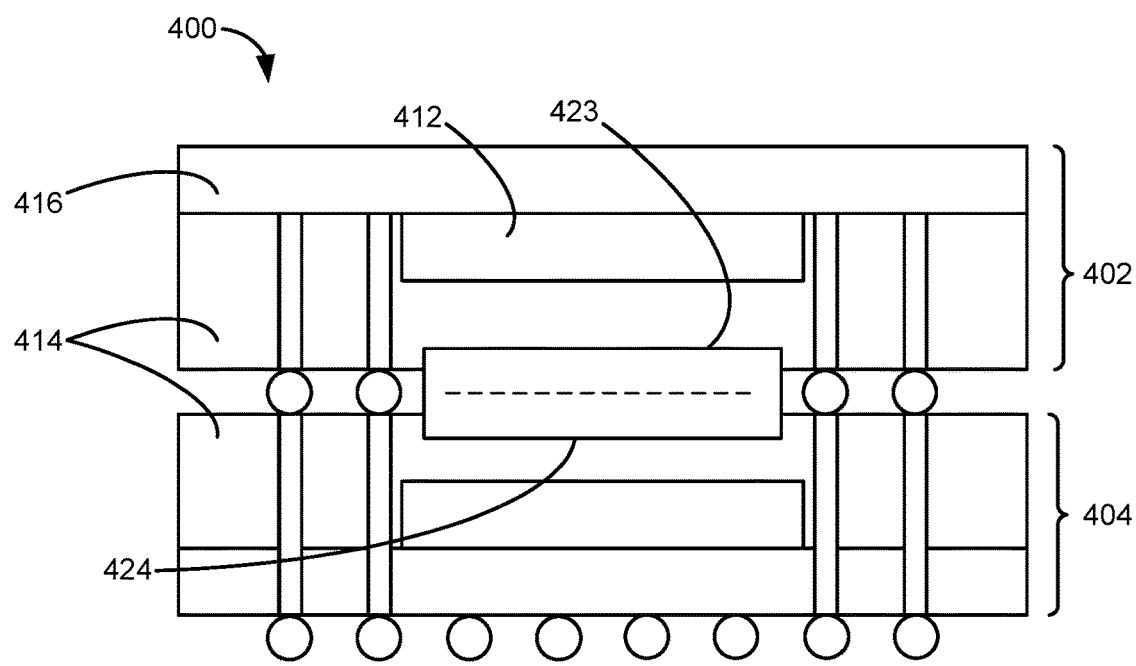
FIG. 4 is a cross-sectional view of an electronic device in accordance with a further embodiment of the present technology.

FIG. 4 is a cross-sectional view of an electronic device 400 (e.g., a semiconductor die assembly or package, including a POP device) in accordance with a further embodiment of the present technology. The electronic device 400 can include a first package 402 (e.g., a memory device), a second package 404 (e.g., a logic device), or a combination thereof. The first package 402, the second package 404, or a combination thereof can be semiconductor die assemblies or packages.

The electronic device 400 can be similar to the electronic device 300 of FIG. 3. For example, the first package 402, the second package 404, or a combination thereof can include one or more semiconductor dies 412, one or more substrates 414, encapsulation 416, or a combination thereof. Also for example, the electronic device 400 can include a Peltier device 422 including a heating portion 423 and a cooling portion 424. In some embodiments, the Peltier device 422 can be directly attached or embedded in the encapsulations of the first package 402 and the second package 404. For example, the first package 402 and the second package 404 can face each other (e.g., such as having the die-attached surface of the substrates in the two packages facing each other). The Peltier device 422 can be between the first package 402 and the second package 404. The heating portion 423 can be directly attached to or embedded in the encapsulation of the first package 402 (e.g., the memory package) and the cooling portion 424 can be directly attached to or embedded in the encapsulation of the second package 404 (e.g., the logic package).

Figure 5:
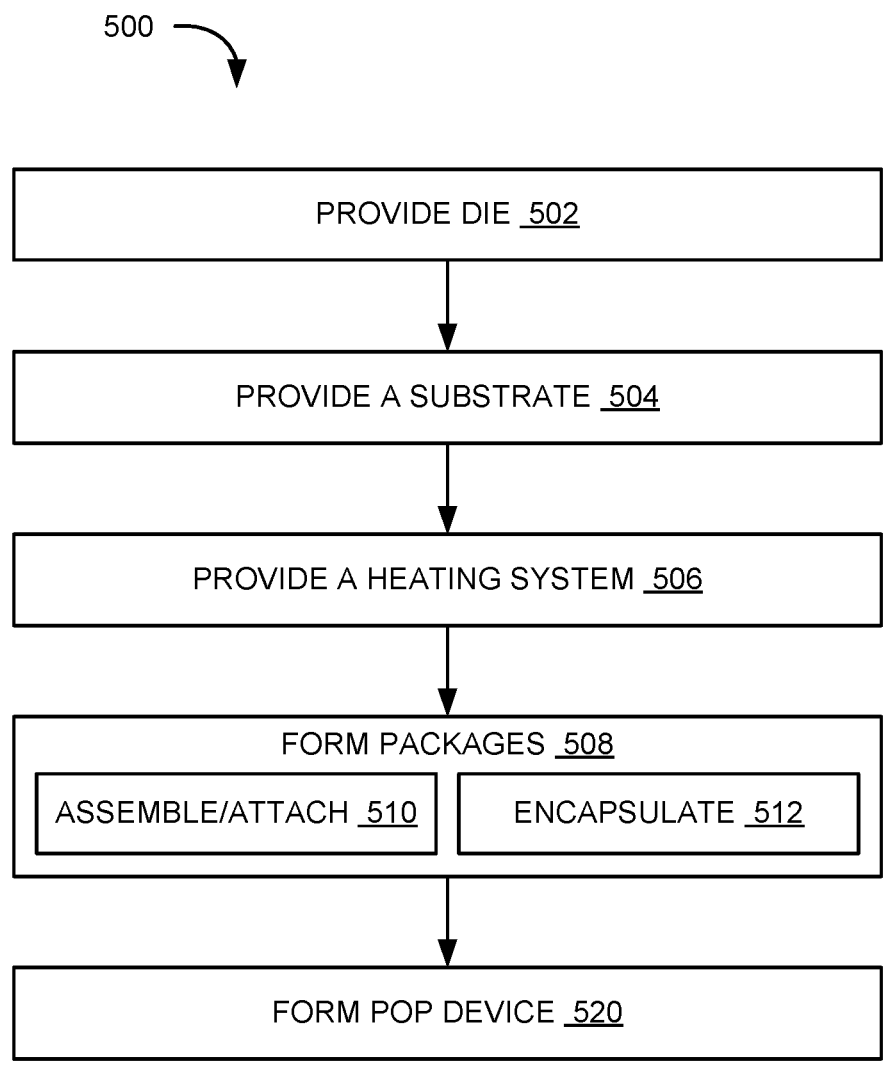
FIG. 5 is a flow diagram illustrating an example method of manufacturing an electronic device in accordance with an embodiment of the present technology.

FIG. 5 is a flow diagram illustrating an example method 500 of manufacturing an electronic device in accordance with an embodiment of the present technology. The method 500 can be for manufacturing the electronic device 100 of FIG. 1, the electronic device 200 of FIG. 2, the electronic device 300 of FIG. 3, the electronic device 400 of FIG. 4, or a combination thereof.

At block 502, one or more dies (e.g., semiconductor dies) can be provided. For example, dies such as the die 102 of FIG. 1, the die 212 of FIG. 2, the die 312 of FIG. 3, the die 412 of FIG. 4, etc. can be provided for manufacturing the electronic device. In some embodiments, providing the dies can include manufacturing or forming the dies (e.g., based on wafer-level processing). In some embodiments, providing the dies can include positioning the dies, stacking the dies, or a combination thereof.

At block 504, one or more substrates (e.g., printed circuit boards (PCBs), another or bottom die, wafer-level substrate, etc.) can be provided. For example, the substrates such as the substrate 104 of FIG. 1, the substrate 214 of FIG. 2, the substrate 314 of FIG. 3, the substrate 414 of FIG. 4, etc. can be provided for manufacturing the electronic device. In some embodiments, providing the substrates can include manufacturing or forming the substrates. In some embodiments, providing the substrates can include positioning the substrate, forming traces, forming one or more die-attach pad (e.g., such as one or more of the thermal contacts 126 of FIG. 1, the thermal-conduction component 128 of FIG. 1, the thermal contact 326 of FIG. 3, etc.) within the substrate, connecting circuitry components, etc.

At block 506, one or more heating systems (e.g., heating elements, sensors, control circuits, thermal contacts, thermal conduction components, etc.) can be provided. For example, heating systems including one or more of the die-level heaters 122 of FIG. 1, the die-level heaters 222 of FIG. 2, the package-level heaters 124 of FIG. 1, the package-level heaters 224 of FIG. 2, the thermal sensors 125 of FIG. 1, the thermal contacts 126, the thermal-conduction component 128 of FIG. 1, the temperature control circuit 132 of FIG. 1, the Peltier device 322 of FIG. 3, the thermal contact 326, the Peltier device 422 of FIG. 4, etc. can be provided for manufacturing the electronic device. In some embodiments, providing the heating system can include manufacturing or forming the heating systems or components therein (e.g., forming die-level heaters, sensors, control circuit, etc. in the die). In some embodiments, providing the heating system can include positioning the heating system or components therein, connecting the system components, etc.

At block 508, individual packages (e.g., semiconductor packages) can be formed. For example, packages such as the electronic device 100, the first package 202 of FIG. 2, the second package 204 of FIG. 2, the first package 302 of FIG. 3, the second package 304 of FIG. 3, the first package 402 of FIG. 4, the second package 404 of FIG. 4, etc. can be formed. In some embodiments, forming the packages can include assembling or attaching the components, encapsulating the components, or a combination thereof.

At block 510, components of the individual package can be assembled or attached together. For example, one or more dies can be attached to the substrate. Also for example, the components of the heating system can be attached to each other or assembled. Also for example, the heating system can be connected or attached to other devices or circuits (e.g., heating elements can be attached to dies, substrates, thermal contacts, thermal conduction components, traces, etc.).

At block 512, components of the individual package can be encapsulated. For example, the one or more dies, the substrate (e.g., the surface of the substrate having the dies attached thereon), the heating system, a portion thereof, or a combination thereof can be encapsulated within or attached to the encapsulation (e.g., the encapsulation 106 of FIG. 1, the encapsulation 216 of FIG. 2, the encapsulation 316 of FIG. 3, the encapsulation 416 of FIG. 4, etc.). Encapsulating the components can include flowing the encapsulant (e.g., resin or plastic type material), hardening the encapsulant (e.g., based on heat, settling time, light or radiation, etc.), shaping the encapsulant, etc. In some embodiments, the encapsulant can include thermally conductive material. In some embodiments, forming the encapsulation can further include forming or attaching the thermal-isolation component 130 of FIG. 1 on the outer surface of the encapsulation. In some embodiments, encapsulating the components can include forming the thermally-conductive TSV 232 of FIG. 2 and/or forming the encapsulation around the thermally-conductive TSV 232.

At block 520, multiple packages can be attached to each other to form POP devices. For example, the POP device (e.g., the electronic device 200 the electronic device 300, the electronic device 400, etc.) can be formed based on attaching multiple individual packages (e.g., the first package 202 and the second package 204, the first package 302 and the second package 304, the first package 402 and the second package 404, etc.). In some embodiments, the packages can be attached using adhesives, solder, etc. In some embodiments, the packages can be attached based on attaching to the Peltier device (e.g., the Peltier device 322 or the Peltier device 422), such as using a thermally conductive adhesive or a mechanical fastening mechanism.

Figure 6:
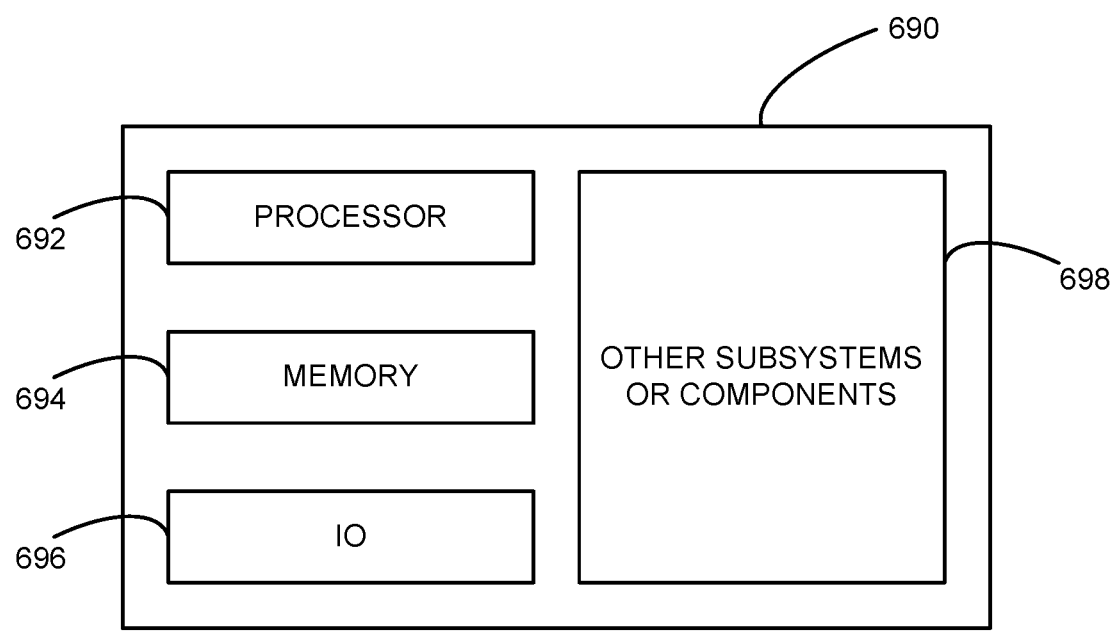
FIG. 6 is a block diagram illustrating a system that incorporates an electronic device in accordance with embodiments of the present technology.

FIG. 6 is a block diagram illustrating a system that incorporates an electronic device in accordance with embodiments of the present technology. Any one of the semiconductor devices having the features described above with reference to FIGS. 1-5 can be incorporated into any of a myriad of larger and/or more complex systems, a representative example of which is system 690 shown schematically in FIG. 6. The system 690 can include a processor 692, a memory 694 (e.g., SRAM, DRAM, flash, and/or other memory devices), input/output devices 696, and/or other subsystems or components 698. The semiconductor assemblies, devices, and device packages described above with reference to FIGS. 1-5 can be included in any of the elements shown in FIG. 6. The resulting system 690 can be configured to perform any of a wide variety of suitable computing, processing, storage, sensing, imaging, and/or other functions. Accordingly, representative examples of the system 690 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 690 include lights, cameras, vehicles, etc. With regard to these and other examples, the system 690 can be housed in a single unit or distributed over multiple interconnected units, e.g., through a communication network. The components of the system 690 can accordingly include local and/or remote memory storage devices and any of a wide variety of suitable computer-readable media.

From the foregoing, it will be appreciated that specific embodiments of the present technology have been described herein for purposes of illustration, but that various modifications may be made without deviating from the disclosure. In addition, certain aspects of the disclosure described in the context of particular embodiments may be combined or eliminated in other embodiments. Further, while advantages associated with certain embodiments have been described in the context of those embodiments, other embodiments may also exhibit such advantages. Not all embodiments need necessarily exhibit such advantages to fall within the scope of the present disclosure. Accordingly, the disclosure and associated technology can encompass other embodiments not expressly shown or described herein.

I claim:

1. An electronic device, comprising:
   a substrate;
   a die attached to the substrate;
   an encapsulation covering the substrate and the die, wherein:
   the die is embedded within the encapsulation, and
   the encapsulation includes thermal-conduction component suspended therein and configured to enhance distribution of the thermal energy through the encapsulation and to the die;
   a heater embedded within the encapsulation, wherein the heater configured to provide thermal energy to the die; and
   a thermal-isolation component directly contacting the encapsulation opposite the die, the thermal-isolation component configured to contain the thermal energy within the electronic device and provide a barrier between the die and a cryogenic environment.

2. The electronic device of claim 1, further comprising a die-level heater directly attached to or integral with the die.

3. The electronic device of claim 1, wherein the heater is directly attached to the substrate without directly contacting the die.

4. The electronic device of claim 1, further comprising:
   a thermal sensor embedded within the encapsulation, wherein the thermal sensor is configured to determine an operating temperature of the die; and
   a control circuit electrically coupled to the thermal sensor and a heating element, the control circuit configured to control the heating element based on the operating temperature.

5. The electronic device of claim 1, further comprising a thermal contact directly contacting the heater and the die, the thermal contact configured to transfer the thermal energy from the thermal contact to the die.

6. The electronic device of claim 1, wherein the heat includes a Peltier device embedded within the encapsulation.

7. The electronic device of claim 6, wherein:
   the Peltier device includes a heating portion and a cooling portion opposite the heating portion;
   further comprising:
   a first package including the substrate, the die, the encapsulation, and the heating portion of the Peltier device, wherein the die is a memory die; and
   a second package attached to the cooling portion of the Peltier device, wherein the second package is a logic device.

8. The electronic device of claim 7, wherein the first package includes the heating portion attached to the substrate for heating the die.

9. The electronic device of claim 7, wherein the first package includes the heating portion attached to the encapsulation for heating the die.

10. The electronic device of claim 1, further comprising:
    a first package including the substrate, the die, the encapsulation, and the heating element, the first package configured to operate at a first operating temperature; and
    a second package attached to the first package, wherein the second package includes a second substrate, a second die, a second encapsulation, and a second heating element and is configured to operate at a second operating temperature lower than the first operating temperature, wherein the second package includes a processor.

11. The electronic device of claim 10, wherein the second package includes a thermal-conduction component configured to lower the second operating temperature.

12. The electronic device of claim 11, wherein the second package includes the thermal-conduction component encapsulating contents of the second package.

13. The electronic device of claim 11, wherein the thermal-conduction component is a thermally-conductive through silicon via.

* * * * *